United States Patent [19]
Yamamoto et al.

[11] Patent Number: 5,387,542
[45] Date of Patent: Feb. 7, 1995

[54] POLYCRYSTALLINE SILICON THIN FILM AND LOW TEMPERATURE FABRICATION METHOD THEREOF

[75] Inventors: Kenji Yamamoto; Yoshifumi Okamoto, both of Kobe, Japan

[73] Assignee: Kanegafuchi Chemical Industry Co., Ltd., Osaka, Japan

[21] Appl. No.: 87,759

[22] PCT Filed: Nov. 16, 1992

[86] PCT No.: PCT/JP92/01491
§ 371 Date: Jul. 12, 1993
§ 102(e) Date: Jul. 12, 1993

[87] PCT Pub. No.: WO93/10555
PCT Pub. Date: May 27, 1993

[30] Foreign Application Priority Data
Nov. 14, 1991 [JP] Japan ................. 3-326887

[51] Int. Cl.$^6$ ............................. H01L 21/20
[52] U.S. Cl. ................... 437/101; 437/2; 437/4; 437/173; 437/233
[58] Field of Search .............. 437/2, 101, 233, 4, 437/173

[56] References Cited

U.S. PATENT DOCUMENTS

| | | | |
|---|---|---|---|
| 4,358,326 | 11/1982 | Doo | 437/101 |
| 4,664,937 | 5/1987 | Ovshinsky | 437/2 |
| 4,741,964 | 5/1988 | Haller | 437/101 |
| 4,762,803 | 8/1988 | Sato et al. | 437/24 |
| 5,221,643 | 6/1993 | Griep | 437/233 |

FOREIGN PATENT DOCUMENTS

| | | |
|---|---|---|
| 0407088 | 6/1990 | European Pat. Off. . |
| 0417942 | 8/1990 | European Pat. Off. . |
| 3206413 | 2/1982 | Germany . |
| 58-21324 | 2/1983 | Japan . |
| 63-31169 | 2/1988 | Japan . |
| 3-139824 | 6/1991 | Japan . |

*Primary Examiner*—R. Bruce Breneman
*Assistant Examiner*—Ramamohan Rao Paladugu
*Attorney, Agent, or Firm*—Nikaido, Marmelstein, Murray & Oram

[57] ABSTRACT

A polycrystalline silicon thin film having a hydrogen content of not more than 5 atomic %, which can be fabricated on an inexpensive glass substrate (3) such as soda glass or on a glass substrate (3) provided with a metal electrode or transparent electrode. The polycrystalline silicon thin film can be fabricated at such a temperature by using multiple repetitions of a process comprising the fabrication of an amorphous silicon film, for example, by the CVD method, followed by exposure to a hydrogen plasma for set period of time.

6 Claims, 3 Drawing Sheets

POLYCRYSTALLINE SILICON THIN FILM AND LOW TEMPERATURE FABRICATION METHOD THEREOF

TECHNICAL FIELD

The present invention relates to a polycrystalline silicon (polysilicon) thin film fabricated on an inexpensive glass substrate and a large-area, low-temperature fabrication method thereof, having potential applications for thin film transistors and thin-film solar cells.

BACKGROUND ART

Since conventional methods for the fabrication of a polysilicon thin film require a high temperatures of more than 650° C., a glass substrate with a softening point of less than 650° C. is not able to be used. In order to avoid diffusion of impurities, it is necessary to use a highly pure quartz glass substrate among glass substrates with a softening point above 650° C.

Recently, a low temperature method using an excimer laser has been intensively researched. In this method, however, only a small area such as 5 mm square is able to be crystallized, so that it is necessary to move the substrate in order to obtain complete crystallization over a large area. When the substrate is moved, nonuniformity of crystallization arises in the boundary region depending upon the moving speed of the substrate, so that it is difficult to uniformly form the polysilicon thin film on a large area.

The present invention is made to resolve the above-mentioned disadvantages of the conventional art, namely, it is an object of the present invention to provide a polysilicon thin film and a low temperature fabrication method thereof in which an inexpensive glass substrate such as a soda glass is used as a substrate.

DISCLOSURE OF THE INVENTION

The polysilicon thin film of the present invention is a polysilicon thin film fabricated on a glass substrate characterized in that the hydrogen content of the film is not more than 5 atomic %.

The polysilicon thin film of the present invention is preferably fabricated over the surface of a metal electrode or transparent electrode, wherein both said metal or transparent electrodes are fabricated on the surface of a glass substrate. Furthermore, the thin polysilicon film is preferably fabricated using repetitions comprising the successive fabrication of amorphous silicon film by the CVD method or PVD method, exposure of the film to hydrogen plasma for a set period of time, and fabrication of further amorphous silicon film.

Moreover, in the present invention, it is preferable that the hydrogen plasma is generated by ECR discharge using permanent magnets, and that pressure thereof is not more than 100 mTorr.

The method of the present invention is a method fabricating a polysilicon film on a glass substrate characterized in that the polysilicon film is formed at a temperature not more than 400° C.

In addition, the fabrication method of the present invention preferably comprises multiple repetitions of a process comprising the fabrication of an amorphous silicon film by the CVD method or PVD method or and subsequent exposure of the amorphous silicon film to a hydrogen plasma for a set period of time.

Moreover, in the method of the present inventions, it is preferable that the above-mentioned CVD method or PVD method and the exposure to hydrogen plasma are carried out in the same chamber.

BEST MODE FOR CARRYING OUT THE INVENTION

Hereinafter the present invention is described on the basis of an embodiment, however, the scope of the present invention is not limited to the embodiment.

As a substrate for fabrication of the thin polysilicon film, insulating substrates such as glass quartz, sapphire and so on, or these substrates on which transparent electrodes such as $TiO_2$, $SnO_2$ and so on are formed can be used.

However, of these substrates, a glass substrate is preferable because of its lower cost, and in particular, an inexpensive soda glass substrate or this having deposited thereon transparent or metal electrodes.

The most important consideration is that since the fabrication temperature of the thin polysilicon film is not more than 400° C., the diffusion of alkali metals, such as Na, and alkaline earth metals, such as Mg, which are present in the glass substrate, is prevented.

Examples 1~2 and Comparative Example

Figure 1:
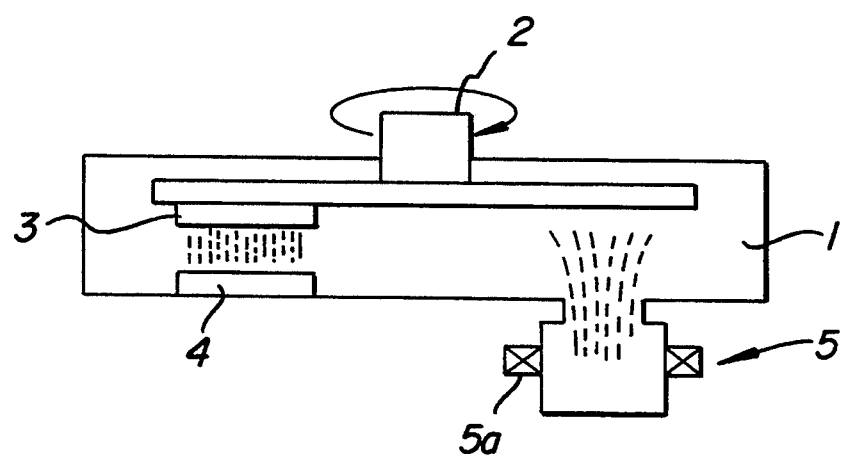
FIG. 1 is a schematic diagram of a film forming apparatus applied to the film fabrication method of the present invention.

Using a CVD apparatus shown in FIG. 1, a polysilicon thin film was deposited onto a glass substrate 3. In the fabricating procedure, firstly an a-Si:H layer is deposited onto the glass substrate 3 to 20 Å a thickness of by RF discharge; and secondly the film on substrate 3 is exposed for about 20~about 30 seconds to an ECR plasma generated by a ECR plasma apparatus 5 constructed with permanent-magnets 5a. By repeating this procedure about 300 times, a polysilicon thin is film of about 6,000 Å thick is obtained (Example 1). In the drawing, number 1 denotes the chamber, number 2 denotes a substrate rotating device, and number 4 denotes the RF electrodes.

Figure 2:
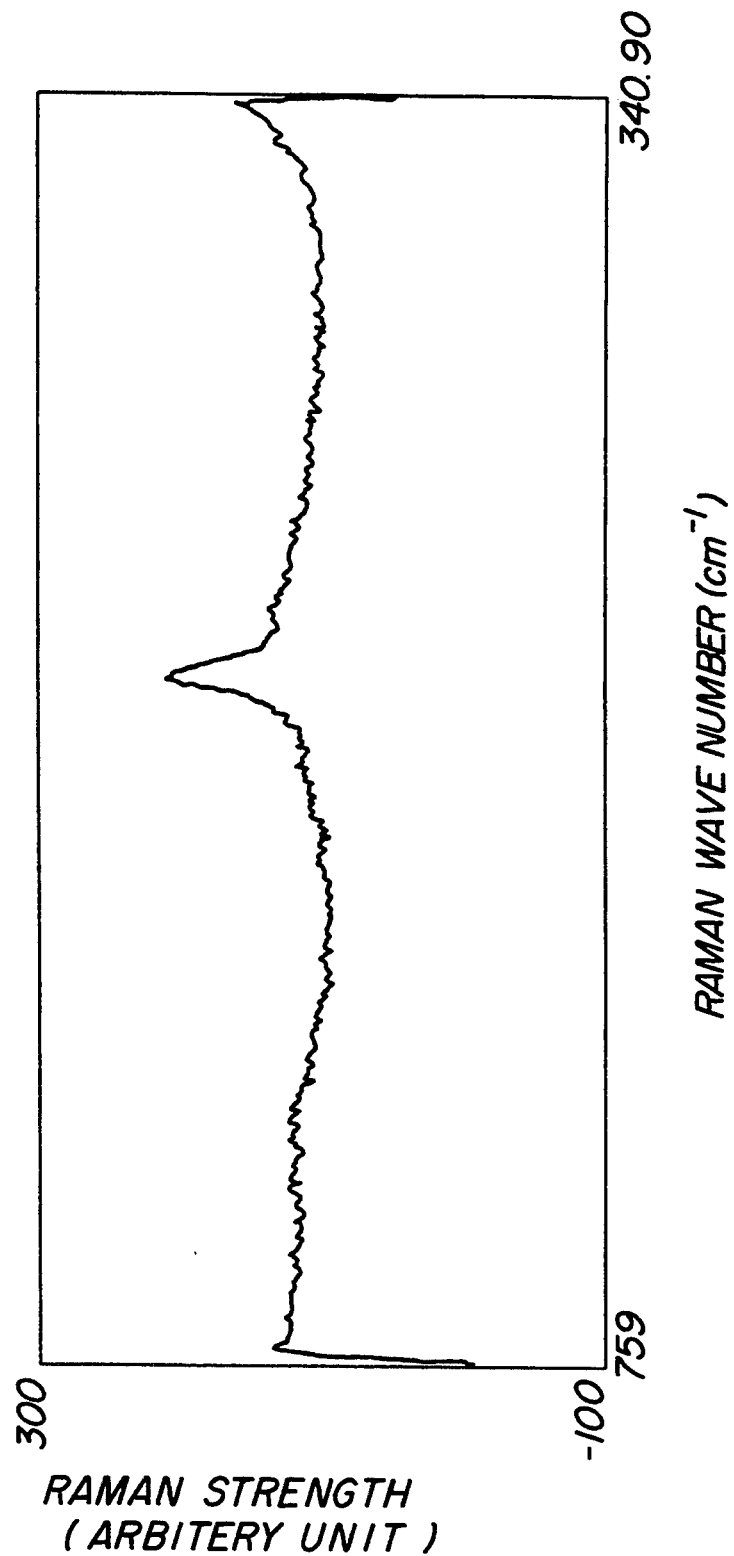
FIG. 2 is the Raman spectrum of an embodiment of the present invention.
Figure 3:
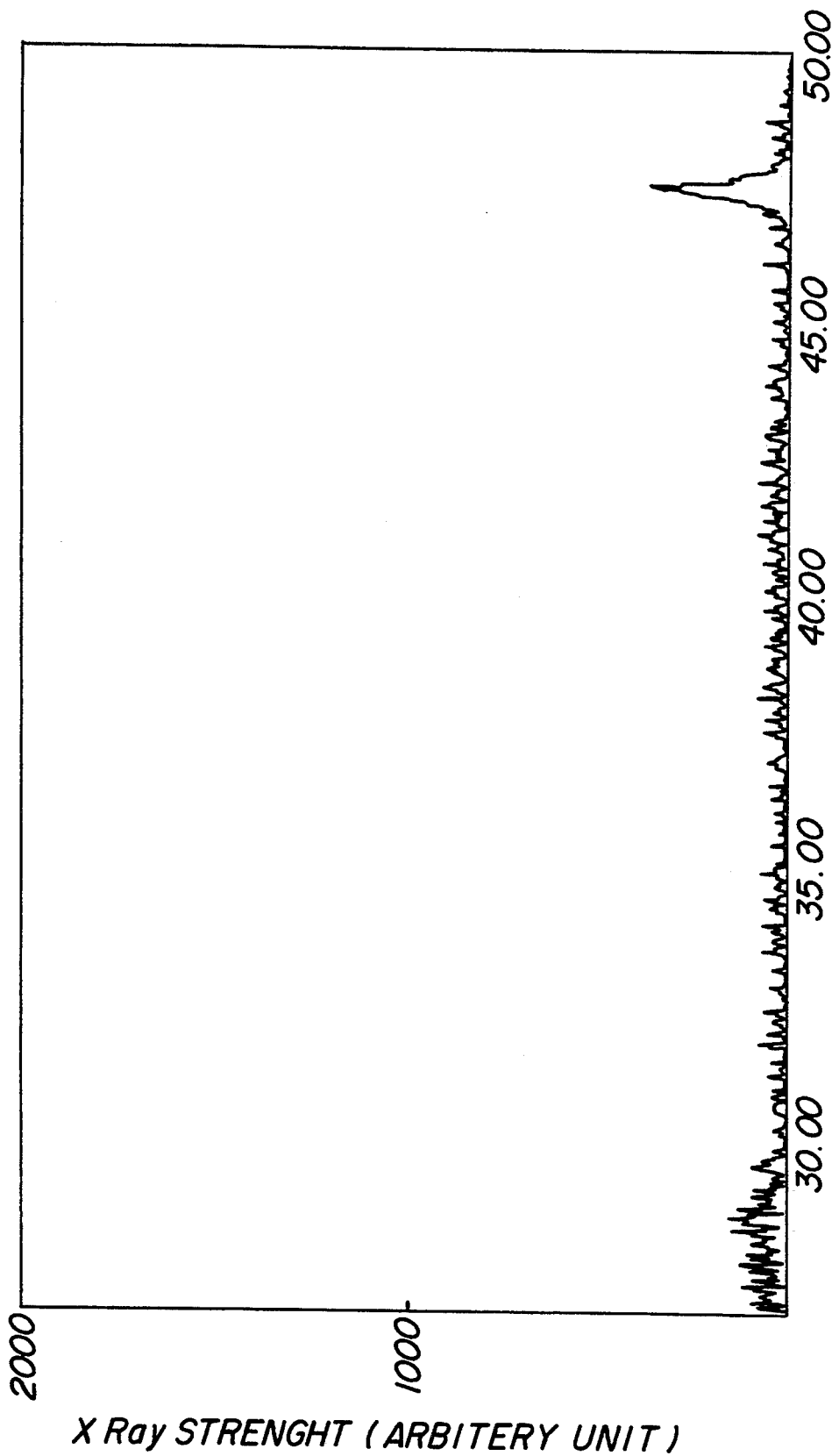
FIG. 3 is the X-ray diffraction spectrum of an embodiment of the present invention.

The condition which the a-Si:H film was formed were: a substrate temperature of 350° C., a pressure of 0.5 Torr, an RF power density of 0.4 W/cm$^2$, a $SiH_4$ gas flow rate of 40 SCCM, and an $H_2$ gas flow rate of 200 SCCM. Further the ECR conditions used were: a pressure of 0.02 Torr, a microwave electrical power of 400 W, and an $H_2$ gas flow rate of 200 SCCM. The Raman spectrum of the fabricated film is shown in FIG. 2, and the X-ray diffraction results in FIG. 3. From the X-ray diffraction of FIG. 3, the polysilicon film is seen to have a strong (110) orientation. In addition, a value of mobility of 20 cm$^2$/Vs was measured for this film using the Van der Paun method. Similary, in the case where the substrate temperature was 250° C., a polysilicon film was also obtained using the above-described method (Example 2).

A characteristic feature of the use of the permanent magnet 5a is that under the influence of the magnetic field, the ions are not accelerated towards the substrate 3 as occurs in the case of a standard ECR apparatus, but instead are accelerated towards the center of the diameter of the field. As a result, both the amount and the energy of ions influxing onto the substrate 3 are small compared with general ECR sources using electromagnets. On the other hand, since radicals diffuse in random directions, a similar amount of radicals is produced as with general ECR sources.

In order to observe the effect of varying the $H_2$ plasma power, namely, the effect of varying the density of Hydrogen radicals, a film was made setting microwave power of 100 W (Comparative Example). In the comparative example, however, no crystallization is observed.

Industrial Applicability

As is mentioned above, since the polysilicon thin film of the present invention is formed onto inexpensive glass substrates, the manufacturing cost is low.

Furthermore, according to the fabrication method of the present invention, polysilicon films can be fabricated at low temperature. Therefore, inexpensive glass can be adopted as a substrate.

We claim:

1. A thin film comprising polycrystalline silicon together with a positive amount of hydrogen up to not more than about 5 atomic percent, based on the total film, which film has a (110) orientation and has an orientation strength ratio of (220)/(111), as measured by X-ray diffraction, of not less than about 10.

2. A thin film as claimed in claim 1 which has been formed by;

disposing a transparent or a metal electrode on a glass substrate;

applying a film of amorphous silicon, by a CVD or PVD method, onto said substrate in effective contact with said electrode;

exposing said film of amorphous silicon to a plasma, comprising hydrogen, which has been generated by ECR discharge under microwave electrical power of not less than about 300 watts in the effective presence of permanent magnets;

wherein said exposure is under conditions including;

a pressure of not more than about 100 mTorr, and an exposure time sufficient to convert said amorphous silicon to polycrystalline silicon having said orientation and said orientation strength ratio; and repeating said film application and exposure steps a sufficient number of times to produce said polysilicon film.

3. A thin film as claimed in claim 1 wherein the band gap of said polycrystalline silicon is about 1.1 eV.

4. A method of making a thin film comprising polysilicon containing a positive amount of hydrogen up to not more than about 5 atomic percent which comprises:

disposing a transparent or a metal electrode on a glass substrate;

carrying out a CVD or a PVD method under conditions sufficient to apply a film of amorphous silicon onto said substrate in effective contact with said electrode;

exposing said film of amorphous silicon to a plasma, comprising hydrogen, which has been generated by ECR discharge under microwave electrical power of not less than about 300 watts in the effective presence of permanent magnets;

wherein said exposure is under conditions including;

a pressure of not more than about 100 mTorr, and an exposure time sufficient to convert said amorphous silicon to polycrystalline silicon having said (110) orientation and said orientation strength ratio; and repeating said film application and exposure steps a sufficient number of times to produce said polysilicon film.

5. A method as claimed in claim 4 wherein said CVD or PVD methods and said exposure to said hydrogen containing plasma are carried out in a single chamber.

6. A method as claimed in claim 5 wherein said exposure of said amorphous silicon film to said plasma is carried out at a temperature of up to about 400° C.

* * * * *